(12) United States Patent
Hsu et al.

(10) Patent No.: US 10,312,222 B2
(45) Date of Patent: Jun. 4, 2019

(54) SEMICONDUCTOR PACKAGE AND SEMICONDUCTOR DEVICE USING THE SAME

(71) Applicant: MEDIATEK Inc., Hsin-Chu (TW)

(72) Inventors: Wen-Sung Hsu, Zhubei (TW); Shih-Chin Lin, Taoyuan (TW); Tao Cheng, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/848,083

(22) Filed: Dec. 20, 2017

(65) Prior Publication Data

US 2018/0114779 A1    Apr. 26, 2018

Related U.S. Application Data

(63) Continuation of application No. 15/162,724, filed on May 24, 2016, now Pat. No. 9,881,902.
(Continued)

(51) Int. Cl.
*H01L 25/065* (2006.01)
*H01L 23/498* (2006.01)
(Continued)

(52) U.S. Cl.
CPC ........ *H01L 25/0657* (2013.01); *H01L 21/486* (2013.01); *H01L 21/4853* (2013.01);
(Continued)

(58) Field of Classification Search
CPC ........... H01L 25/0657; H01L 23/49805; H01L 21/486; H01L 21/52; H01L 25/50; H01L 21/4853; H01L 23/49827; H01L 21/568; H01L 23/5389; H01L 25/105; H01L 23/49811; H01L 2924/1436; H01L 2924/1434; H01L 2225/0652; H01L 2225/06517; H01L 2225/06572;
(Continued)

(56) References Cited

U.S. PATENT DOCUMENTS 8,383,457 B2    2/2013 Pagaila et al.
8,445,323 B2    5/2013 Lin et al.
(Continued)

FOREIGN PATENT DOCUMENTS

CN    102386113 A    3/2012
TW    200415762 A    8/2004
(Continued)

OTHER PUBLICATIONS

TIPO Office Action dated Aug. 7, 2017 in Taiwan application (No. 105120334).
(Continued)

*Primary Examiner* — Sonya D. McCall-Shepard
(74) *Attorney, Agent, or Firm* — McClure, Qualey & Rodack, LLP (57) ABSTRACT

A semiconductor package includes a substrate, a first electronic component, a first conductive layer, a first pillar layer and a first package body. The first electronic component is disposed on the substrate. The first pillar layer connects the first conductive layer and the substrate. The first package body encapsulates the first conductive layer, the first pillar layer and the first electronic component. The first conductive layer is embedded in the first package body.

20 Claims, 12 Drawing Sheets

Related U.S. Application Data (60) Provisional application No. 62/201,254, filed on Aug. 5, 2015, provisional application No. 62/202,627, filed on Aug. 7, 2015.

(51) Int. Cl.

| | | |
|---|---|---|
| *H01L 21/48* | (2006.01) | |
| *H01L 21/52* | (2006.01) | |
| *H01L 25/00* | (2006.01) | |
| *H01L 21/56* | (2006.01) | |
| *H01L 23/538* | (2006.01) | |
| *H01L 25/10* | (2006.01) | |

(52) U.S. Cl.
CPC .......... *H01L 21/52* (2013.01); *H01L 21/568* (2013.01); *H01L 23/49805* (2013.01); *H01L 23/49811* (2013.01); *H01L 23/49827* (2013.01); *H01L 23/5389* (2013.01); *H01L 25/105* (2013.01); *H01L 25/50* (2013.01); *H01L 2224/16227* (2013.01); *H01L 2224/16235* (2013.01); *H01L 2224/48235* (2013.01); *H01L 2225/0652* (2013.01); *H01L 2225/06517* (2013.01); *H01L 2225/06572* (2013.01); *H01L 2225/1023* (2013.01); *H01L 2225/1041* (2013.01); *H01L 2225/1058* (2013.01); *H01L 2924/1434* (2013.01); *H01L 2924/1436* (2013.01); *H01L 2924/15311* (2013.01); *H01L 2924/15331* (2013.01); *H01L 2924/19041* (2013.01); *H01L 2924/19042* (2013.01); *H01L 2924/19043* (2013.01)

(58) Field of Classification Search
CPC . H01L 2924/15331; H01L 2224/16235; H01L 2224/16227; H01L 2924/19041; H01L 2225/1058; H01L 2924/19042; H01L 2924/19043; H01L 2924/15311; H01L 2225/1023; H01L 2224/48235; H01L 2225/1041

See application file for complete search history.

(56) References Cited

U.S. PATENT DOCUMENTS

| | | |
|---|---|---|
| 9,385,006 B2 | 7/2016 | Lin et al. |
| 2009/0236686 A1 | 9/2009 | Shim et al. |
| 2012/0056329 A1 | 3/2012 | Pagaila et al. |
| 2012/0061814 A1 | 3/2012 | Camacho et al. |
| 2013/0175707 A1 | 7/2013 | Chew et al. |
| 2013/0341786 A1 | 12/2013 | Hsu et al. |
| 2015/0084185 A1 | 3/2015 | Kim et al. |
| 2016/0343695 A1 | 11/2016 | Lin et al. |
| 2016/0351543 A1 | 12/2016 | Ryu et al. |

FOREIGN PATENT DOCUMENTS

| | | |
|---|---|---|
| TW | 201101399 A | 1/2011 |
| TW | 201327745 A1 | 7/2013 |
| TW | 201401466 A | 1/2014 |
| TW | 201426960 A | 7/2014 |
| TW | 201517187 A | 5/2015 |

OTHER PUBLICATIONS

EP Search Report dated Oct. 14, 2016 in EP Application (No. 16175709.1-1552).

TIPO Office Action dated Mar. 2, 2017 in Taiwan application (No. 105120334).

CN Office Action dated May 28, 2018 in Chinese application (No. 201610614500.3).

SEMICONDUCTOR PACKAGE AND SEMICONDUCTOR DEVICE USING THE SAME

This is a Continuation of U.S. application Ser. No. 15/162,724, filed May 24, 2016, which claims the benefit of U.S. provisional application Ser. No. 62/201,254, filed Aug. 5, 2015, and the benefit of Ser. No. 62/202,627, filed Aug. 7, 2015, the subject matters of which are incorporated herein by references.

FIELD OF THE INVENTION

The invention relates to a semiconductor package and a semiconductor device using the same, and more particularly to a thin semiconductor package and a semiconductor device using the same.

BACKGROUND OF THE INVENTION

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical.

Package-on-package (PoP) is now the fastest growing semiconductor package technology since it is a cost-effective solution to high-density system integration in a single package. In a PoP structure, various packages are integrated in a single semiconductor package to reduce the size. Accordingly, there exists a need to provide a semiconductor package to overcomes, or at least reduces the above-mentioned problems.

Therefore, it is important to increase the performance of the 3D graphic processing circuit while reducing the consumption of the electric power and extending the operating time of the mobile device.

SUMMARY OF THE INVENTION

In one embodiment of the invention, a semiconductor package is provided. The semiconductor package includes a substrate, a first electronic component, a first conductive layer and a first package body. The first electronic component is disposed on the substrate. The first package body encapsulates the first conductive layer and the first electronic component. The first conductive layer is embedded in the first package body.

In another embodiment of the invention, a semiconductor package is provided. The semiconductor package includes a substrate, a first electronic component, a first conductive layer, a first package body, a second conductive layer, a second pillar layer and a second package body. The first electronic component is disposed on the substrate. The first package body encapsulates the first conductive layer and the first electronic component. The second pillar layer connects the first conductive layer and the second conductive layer. The second package body encapsulates the second conductive layer and the second pillar layer. The first conductive layer is embedded in the first package body.

In another embodiment of the invention, a semiconductor device is provided. The semiconductor device includes a semiconductor package and a second electronic component. The semiconductor package includes a substrate, a first electronic component, a first conductive layer and a first package body. The first electronic component is disposed on the substrate. The first package body encapsulates the first conductive layer and the first electronic component. The first conductive layer is embedded in the first package body. The second electronic component is disposed on the first conductive layer of the semiconductor package.

In another embodiment of the invention, a semiconductor device is provided. The semiconductor device includes a semiconductor package and a second electronic component. The semiconductor package includes a substrate, a first electronic component, a first conductive layer, a first package body, a second conductive layer, a second pillar layer and a second package body. The first electronic component is disposed on the substrate. The first package body encapsulates the first conductive layer and the first electronic component. The second pillar layer connects the first conductive layer and the second conductive layer. The second package body encapsulates the second conductive layer and the second pillar layer. The first conductive layer is embedded in the first package body. The second electronic component is disposed on the second conductive layer of the semiconductor package.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
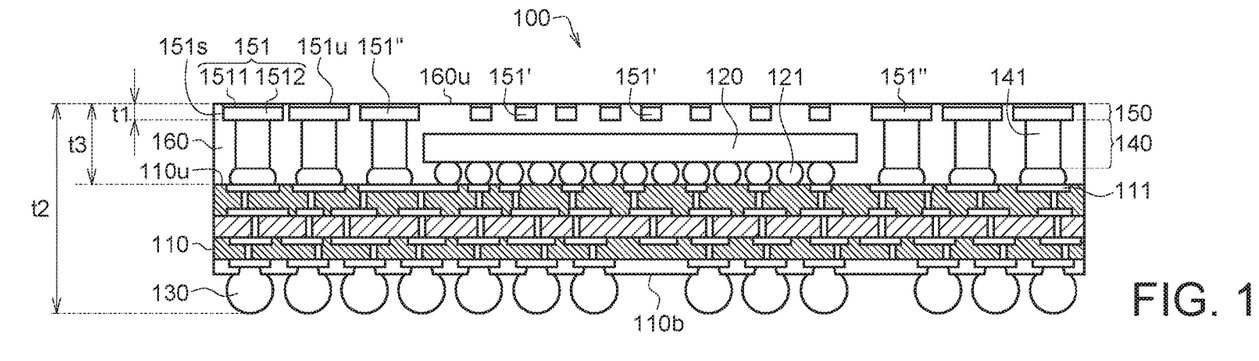
FIG. 1 illustrates a diagram of a semiconductor package according to an embodiment of the invention.

FIG. 1 illustrates a diagram of a semiconductor package 100 according to an embodiment of the invention. The semiconductor package 100 includes a substrate 110, at least one first electronic component 120, at least one conductive contact 130, a first pillar layer 140, a first conductive layer 150 and a first package body 160.

The substrate 110 is, for example, a multi-layered structure or single-layered structure. The substrate 110 may be organic substrate, ceramic substrate, silicon substrate, metal substrate, etc. The substrate 110 includes a plurality of pads 111 for electrically connecting to the first pillar layer 140.

In the present embodiment, the first electronic component 120 is coupled to an upper surface 110u of the substrate 110 in a "face-down" orientation and electrically connected to the substrate 110 via a plurality of conductive contacts 121.

This configuration is sometimes referred to as "flip-chip". The conductive contact 121 may be solder ball, conductive pillar, etc.

In other embodiments, the first electronic component 120 may be coupled to the substrate 110 in a "face-up" orientation, and electrically connected to the substrate 110 via a plurality of conductive bond wires (not shown). The first electronic component 120 may be an active chip or a passive component, such as a resistor, an inductor or a capacitor. In another embodiment, the number of the first electronic component 120 may be several.

In addition, the first electronic component 120 is, for example, a chip, a passive component, such as a resistor, an inductor or a capacitor. In another embodiment, the number of the first electronic component 120 may be plural.

The conductive contacts 130 are disposed on a lower surface 110b of the first substrate 110. The semiconductor package 100 may be disposed on and electrically connected to an exterior circuit, such as a circuit board, through the conductive contacts 130. The conductive contact 130 may be solder ball, conductive pillar, etc.

The first pillar layer 140 connects the first conductive layer 150 and the substrate 110 for electrically connecting the first conductive layer 150 and the substrate 110. In the present embodiment, the first pillar layer 140 includes a plurality of pillars 141. The pillars 141 may be made of a material such as copper.

The first conductive layer 150 includes a plurality of elements 151, such as pads, traces or combination thereof. In the present embodiment, the elements 151 may include a plurality of first elements 151' and a plurality of second elements 151", wherein the first elements 151' are traces, and the second elements 151" are first pads. Alternatively, all elements 151 may be first pads or traces. Although not illustrated, at least one first element 151' may connect to at least one second element 151".

The first elements 151' are formed above the first electronic component 120, and no pillar is located between the first elements 151' and the first electronic component 120; however, such exemplification is not meant to be for limiting.

Each element 151 may be a multi-layered structure or single-layered structure. For example, each element 151 includes a first layer 1511 and a second layer 1512. The first layer 1511 and the second layer 1512 may be nickel, gold, copper or combination thereof. In an embodiment, the first layer 1511 includes a surface finishing and/or a seed layer.

Each element 151 (trace or pad) has a first lateral surface 151s and a first upper surface 151u, the first upper surface 151u is exposed from a second upper surface 160u of the first package body 160, and the first package body 160 encapsulates the first lateral surface 151s of the first conductive layer 150.

The first conductive layer 150 has a thickness t1 ranging between 10 micrometers and 20 micrometers. Compared to the interposer, the thickness t1 of first conductive layer 150 is much smaller. In general, the interposer has a thickness larger than 100 micrometers. In the present embodiment, the semiconductor package 100 may omit the interposer, and accordingly the thickness t2 of the semiconductor package 100 can be reduced.

The first package body 160 encapsulates the first conductive layer 150, the first pillar layer 140 and the first electronic component 120. The first package body 160 may be made of the same material. For example, the first package body 160 is a molding compound which is made of a material including, for example, a Novolac-based resin, an epoxy-based resin, a silicone-based resin, or another suitable encapsulant. Suitable fillers also can be included, such as powdered $SiO_2$.

In one embodiment, the first package body 160 has a thickness t3. The first conductive layer 150 is embedded in the first package body 160, and accordingly the thickness t3 of the first package body 160 is not required to be increased.

In addition, the first upper surface 151u of the first conductive layer 150 and the second upper surface 160u of the first package body 160 are aligned with each other. For example, the first upper surface 151u and the second upper surface 160u are coplanar.

Figure 2:
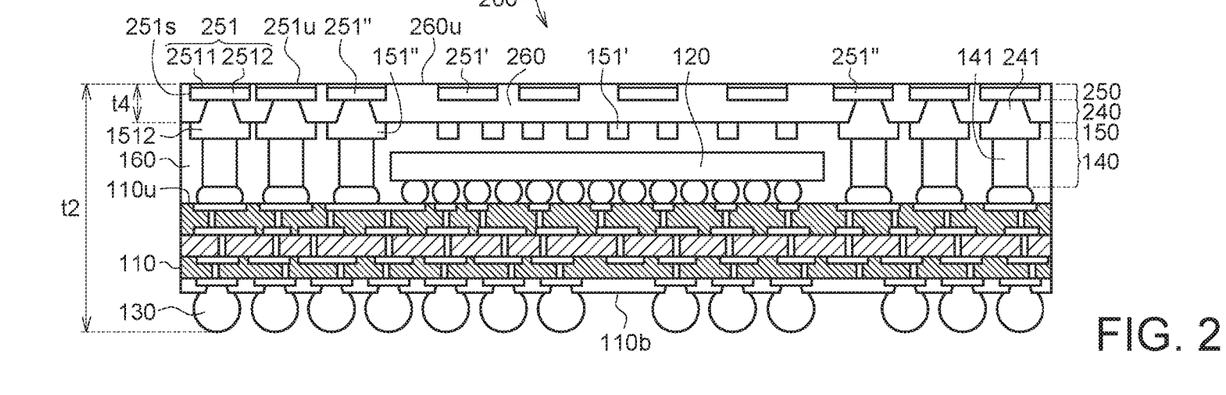
FIG. 2 illustrates a diagram of a semiconductor package according to another embodiment of the invention.

FIG. 2 illustrates a diagram of a semiconductor package 200 according to another embodiment of the invention. The semiconductor package 200 includes the substrate 110, at least one first electronic component 120, at least one conductive contact 130, the first pillar layer 140, the first conductive layer 150, the first package body 160, a second pillar layer 240, a second conductive layer 250 and a second package body 260.

In the present embodiment, the second pillar layer 240, the second conductive layer 250 and the second package body 260 may form a package substrate which electrically connects to the substrate 110 through the first pillar layer 140 and the first conductive layer 150.

The first conductive layer 150 includes a plurality of the elements 151, such as pads, traces or combination thereof. In the present embodiment, the elements 151 may include a plurality of first elements 151' and a plurality of second elements 151", wherein the first elements 151' are traces, and the second elements 151" are first pads. In addition, in the present embodiment, each element 151 is a single-layered structure. For example, each element 151 only includes the second layer 1512, as described above.

The second pillar layer 240 connects the first conductive layer 150 and the second conductive layer 250 for electrically connecting the first conductive layer 150 and the second conductive layer 250. In the present embodiment, the second pillar layer 240 includes a plurality of pillars 241 connecting the first conductive layer 150 and the second conductive layer 250.

The second conductive layer 250 has the structure similar to that of the first conductive layer 150 of FIG. 1.

For example, the second conductive layer 250 includes a plurality of elements 251, such as pads, traces or combination thereof. In the present embodiment, the elements 251 may include a plurality of first elements 251' and a plurality of second elements 251", wherein the first elements 251' and the second elements 251" are second pads. Although not illustrated, at least one first element 251' may connect to at least one second element 251".

The first elements 251' are formed above the first electronic component 120 and the first elements 151', and no pillar is located between the first elements 151' and the first elements 251'; however, such exemplification is not meant to be for limiting. In another embodiment, at least one pillar may connect the first element 251' and the first element 251' through the second package body 260.

Each element 251 may be a multi-layered structure or single-layered structure. For example, the each element 251 includes a first layer 2511 and a second layer 2512. The first layer 2511 and the second layer 2512 may be nickel, gold, copper or combination thereof. In an embodiment, the first layer 2511 includes a surface finishing and/or a seed layer.

Each element 251 (trace or pad) has a second lateral surface 251s and a third upper surface 251u, the second upper surface 251u is exposed from a fourth upper surface 260u of the second package body 260, and the second package body 260 encapsulates the second lateral surfaces 251s.

The second package body 260 encapsulates the second conductive 250 layer and the second pillar layer. The second package body 260 encapsulates the second conductive layer 250 and the second pillar layer 240. The second package body 260 may be made of the same material. For example, the second package body 260 may be made of a lamination.

The second package body 260 has a thickness t4. Compared to an interposer, the thickness t4 of the second package body 260 is much smaller. In general, the interposer has a thickness larger than 100 micrometer. In the present embodiment, the semiconductor package 100 may omit the interposer, and accordingly the thickness t2 of the semiconductor package 200 can be reduced.

In addition, the third upper surface 251u of the second conductive layer 250 and the fourth upper surface 260u of the second package body 260 are aligned with each other. For example, the third upper surface 251u and the fourth upper surface 260u are coplanar.

Figure 3:
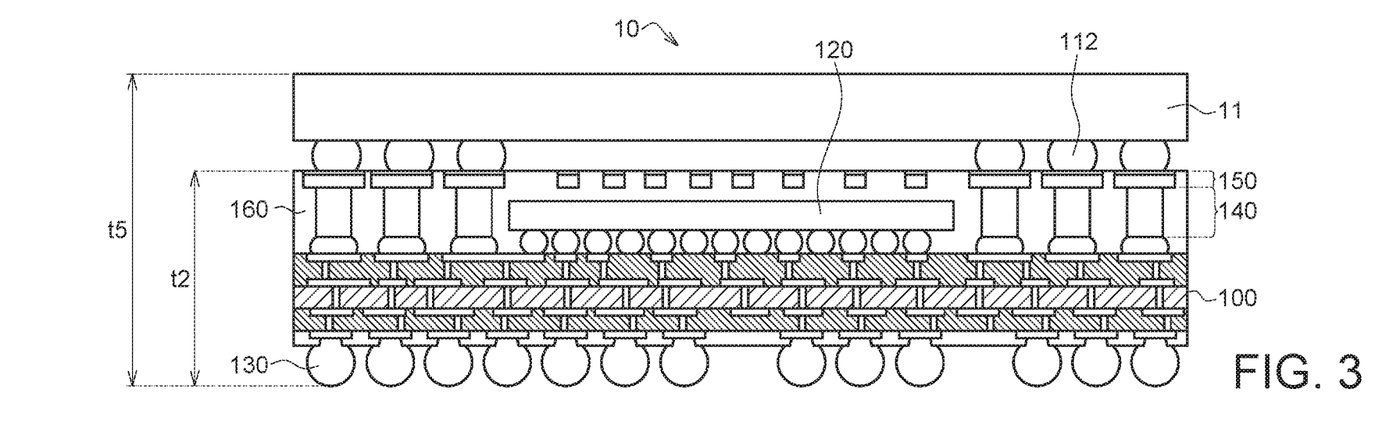
FIG. 3 illustrates a diagram of a semiconductor device according to an embodiment of the invention.

FIG. 3 illustrates a diagram of a semiconductor device 10 according to an embodiment of the invention. The semiconductor device 10 includes the semiconductor package 100 and at least one second electronic component 11.

The semiconductor package 100 includes the substrate 110, at least one first electronic component 120, at least one conductive contact 130, the first pillar layer 140, the first conductive layer 150 and the first package body 160. The second electronic component 11 is disposed on the first conductive layer 150 of the semiconductor package 100 in a "face-down" orientation and electrically connected to the first conductive layer 150 via a plurality of conductive contacts 112. The conductive contact 112 may be solder ball, conductive pillar, etc. In another embodiment, the second electronic component 11 is disposed on the first conductive layer 150 of the semiconductor package 100 in a "face-up" orientation, and electrically connected to the first conductive layer 150 via a plurality of conductive bond wires (not shown).

The second electronic component 11 may be, for example, a memory, a semiconductor component rather than memory, another semiconductor package, active component, passive component, etc. In another embodiment, the second electronic component 11 may be a semiconductor package including a plurality of dies, such as DRAMs stacked on each other.

In the present embodiment, since the thickness t2 of the semiconductor package 100 may be reduced, the thickness t5 of the semiconductor device 10 may be equal to or less than 1.2 millimeters.

Figure 4:
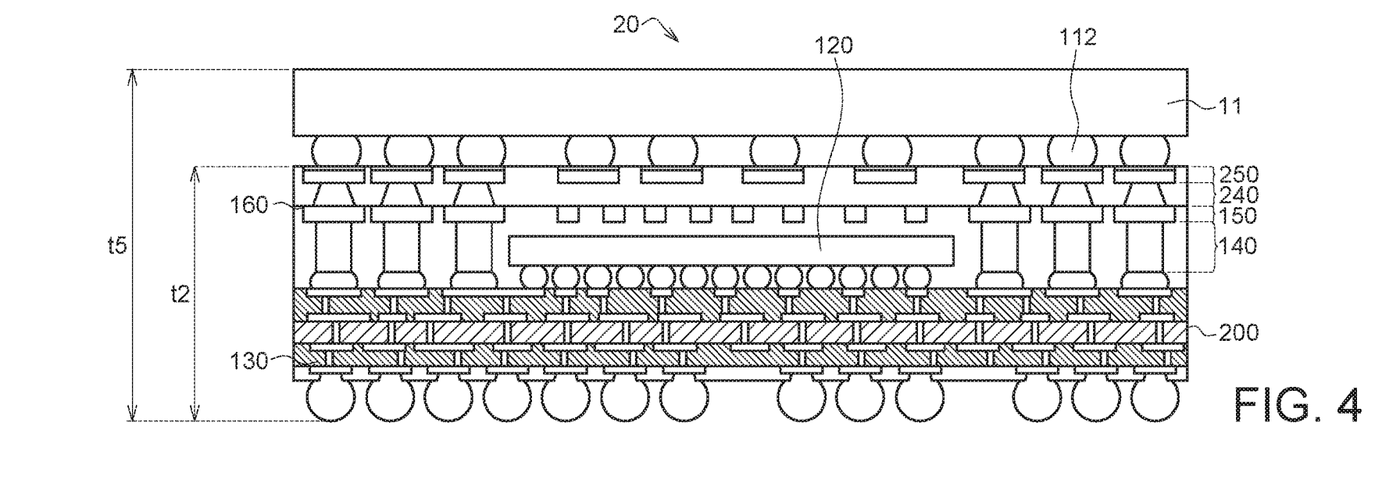
FIG. 4 illustrates a diagram of a semiconductor device according to another embodiment of the invention.

FIG. 4 illustrates a diagram of a semiconductor device 20 according to another embodiment of the invention. The semiconductor device 20 includes the semiconductor package 200 and at least one second electronic component 11.

The semiconductor package 200 includes the substrate 110, at least one first electronic component 120, at least one conductive contact 130, the first pillar layer 140, the first conductive layer 150, the first package body 160, the second pillar layer 240, the second conductive layer 250 and the second package body 260. The second electronic component 11 is disposed on the second conductive layer 250 of the semiconductor package 200 in a "face-down" orientation or in a "face-up" orientation.

In the present embodiment, since the thickness t2 of the semiconductor package 200 may be reduced, the thickness t5 of the semiconductor device 20 may be equal to or less than 1.2 millimeters.

FIGS. 5A to 5H illustrate manufacturing processes of the semiconductor package 100 of FIG. 1.

Figure 5A:
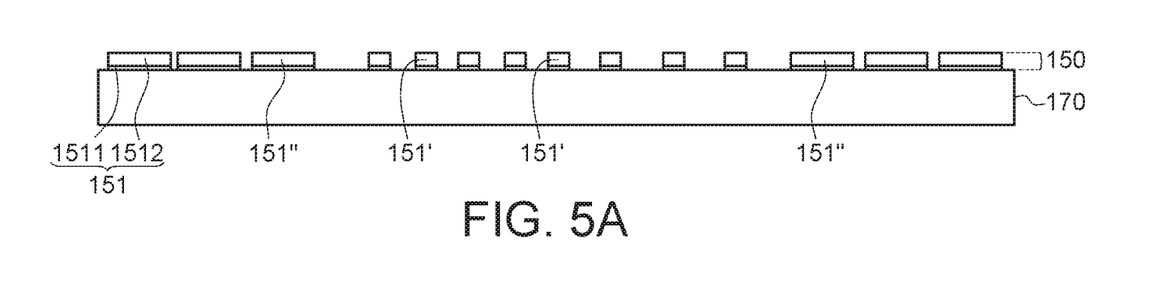
FIGS. 5A to 5H illustrate manufacturing processes of the semiconductor package of FIG. 1.

Referring to FIG. 5A, a carrier 170 is provided. The carrier 170 may be formed by a metal plate comprising of copper, iron or steel.

Referring to FIG. 5A, the first conductive layer 150 is formed on the carrier 170 using, for example, photolithography, electroless plating, electrolytic plating, printing, sputtering, vacuum deposition, etc.

The first conductive layer 150 includes a plurality of elements 151, such as pads, traces or combination thereof. In the present embodiment, the elements 151 may include a plurality of first elements 151' and a plurality of second elements 151", wherein the first elements 151' are traces, and the second elements 151" are first pads. Alternatively, all elements 151 may be first pads or traces. Although not illustrated, at least one first element 151' may connect to at least one second element 151".

Figure 5B:
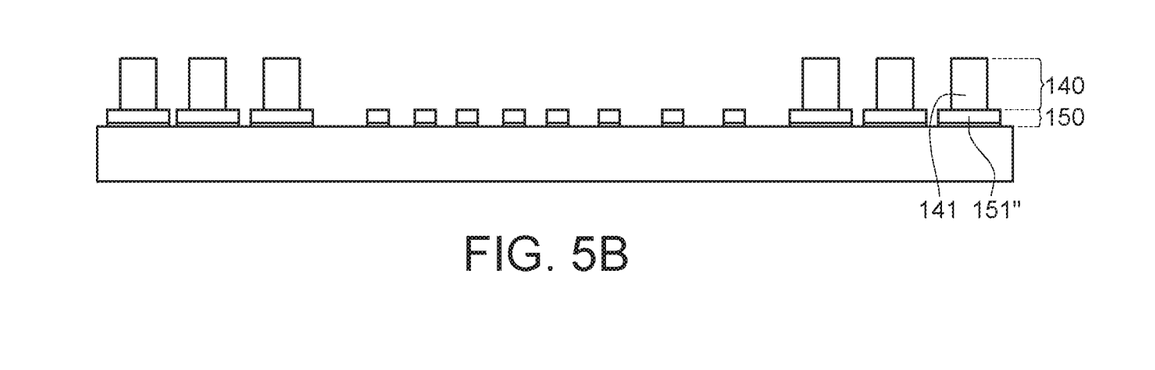

Referring to FIG. 5B, the first pillar layer 140 is formed on the first conductive layer 150 using, for example, photolithography, electroless plating, electrolytic plating, printing, sputtering, vacuum deposition, etc. The first pillar layer 140 includes a plurality of pillars 141 disposed on the second elements 151" of the first conductive layer 150.

Figure 5C:
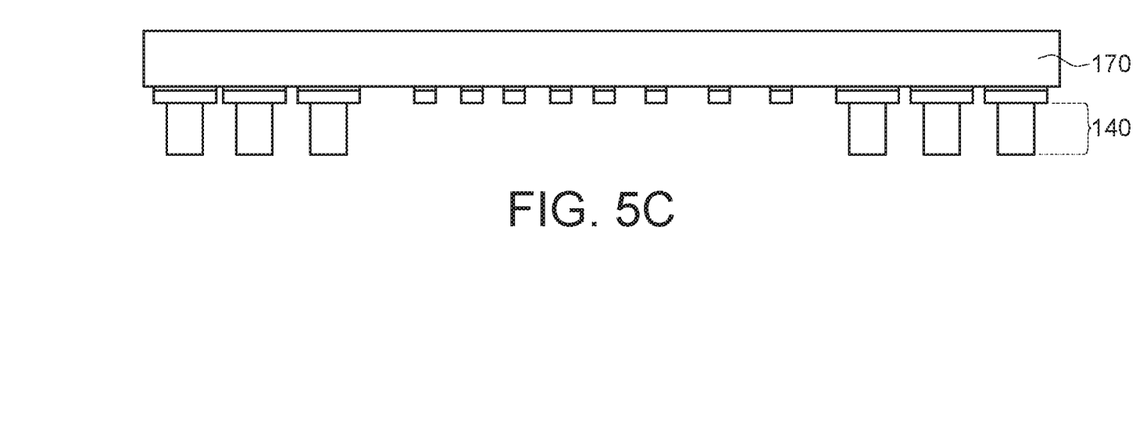

Referring to FIG. 5C, the carrier 170 is inverted, such that the first pillar layer 140 faces down.

Figure 5D:
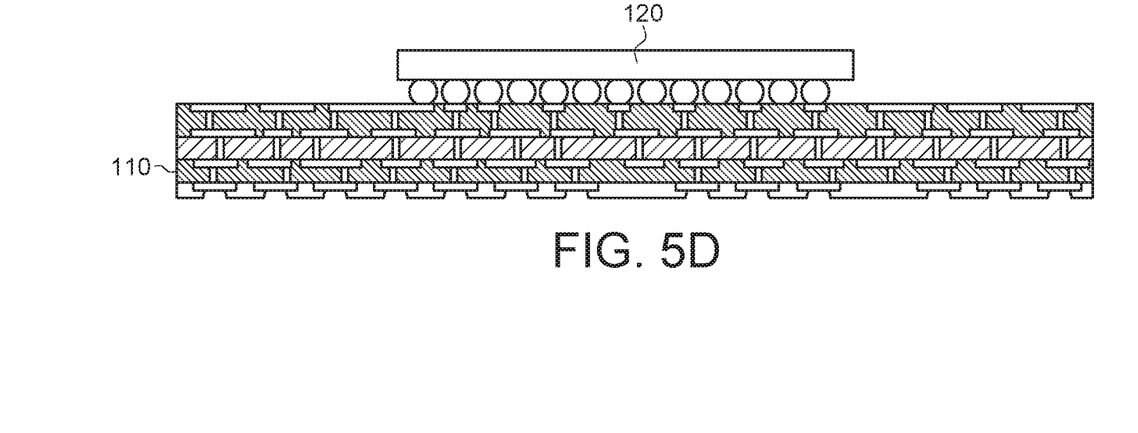

Referring to FIG. 5D, the first electronic component 120 is disposed on the substrate 110 using, for example, surface mount technology (SMT).

Figure 5E:
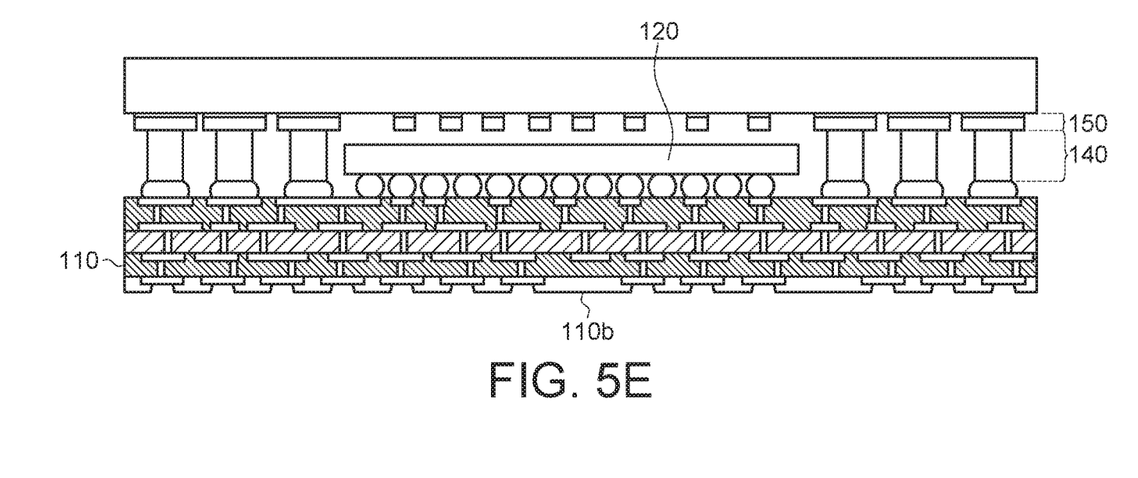

Referring to FIG. 5E, the first pillar layer 140 connects to the substrate 110 using, for example, surface mount technology. The first conductive layer 150 may electrically connect to the first electronic component 120 through the first pillar layer 140 and the substrate 110.

Figure 5F:
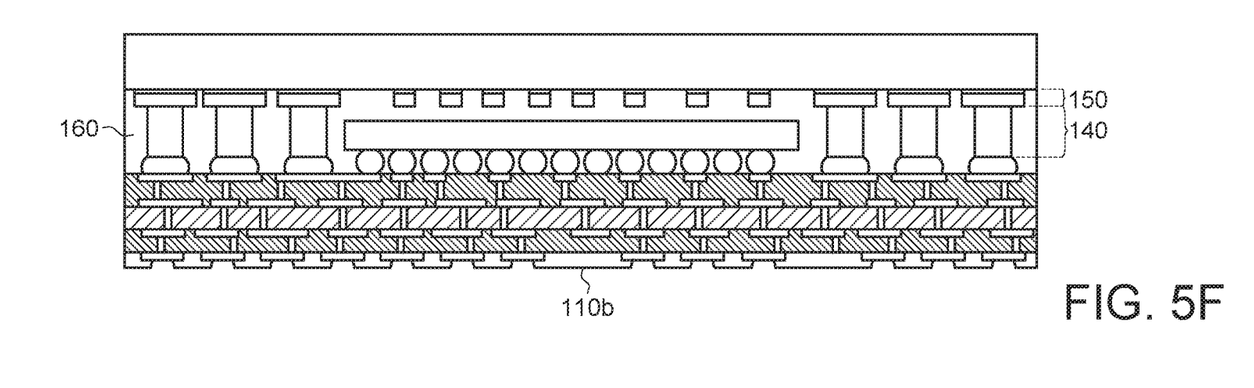

Referring to FIG. 5F, the first package body 160 encapsulating the first conductive layer 150 and the first pillar layer 140 is formed. The first package body 160 may be formed by various packaging technologies, such as, for example, compression molding, injection molding, transfer molding or dispensing technology.

Figure 5G:
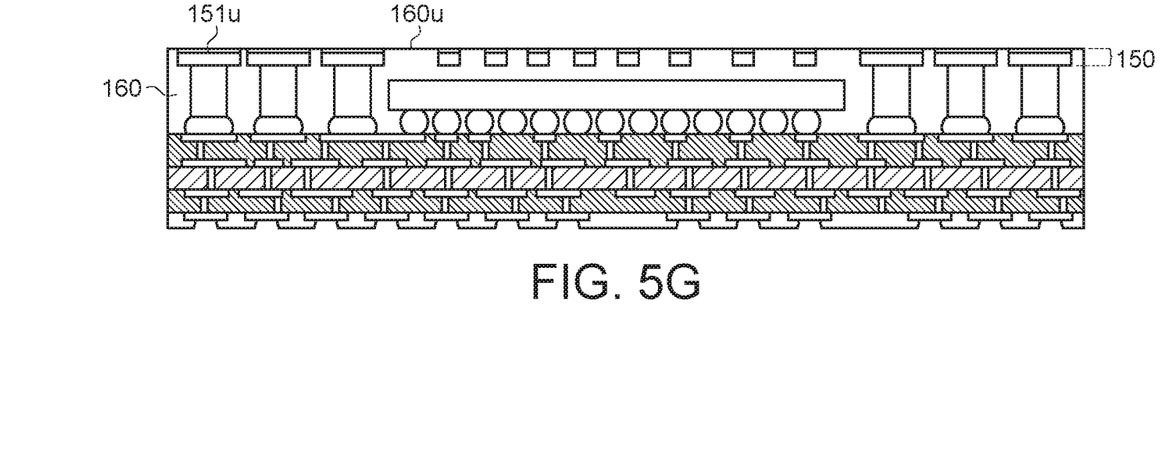

Referring to FIG. 5G, the carrier 170 is removed using, for example, etching, peeling, etc. After the carrier 170 is removed, the first upper surface 151u of the first conductive layer 150 and the second upper surface 160u of the first package body 160 are exposed, wherein the first upper surface 151u and the second upper surface 160u are aligned with each other. For example, the first upper surface 151u and the second upper surface 160u are coplanar.

Figure 5H:
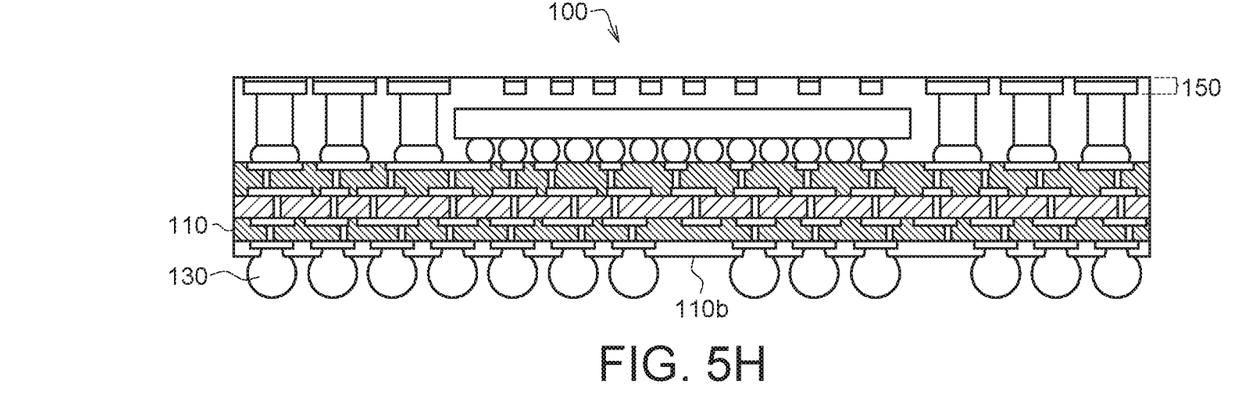

Referring to FIG. 5H, the conductive contacts 130 are formed on the lower surface 110b of the substrate 110 using, for example, ball mounting technology, to form the semiconductor package 100 of FIG. 1.

In another embodiment, the second electronic component 11 of FIG. 1 may be disposed on the first conductive layer 150 of FIG. 5H to form the semiconductor device 10 of FIG. 3.

FIGS. 6A to 6K illustrate manufacturing processes of the semiconductor package 200 of FIG. 2.

Figure 6A:
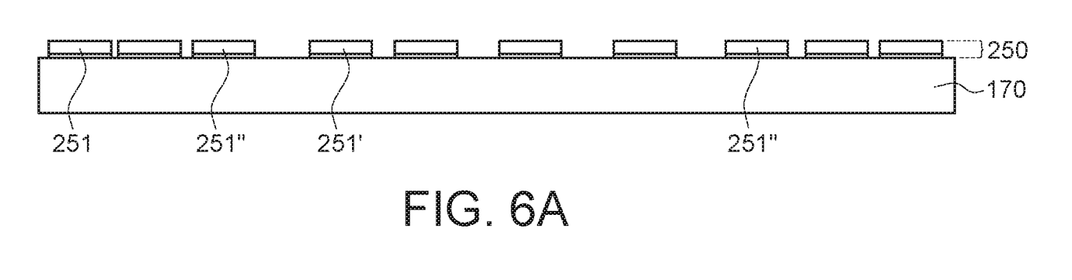
FIGS. 6A to 6K illustrate manufacturing processes of the semiconductor package of FIG. 2.

Referring to FIG. 6A, a carrier 170 is provided. The carrier 170 may be formed by a metal plate including of copper, iron or steel.

Referring to FIG. 6A, the second conductive layer 250 is formed on the carrier 170 using, for example, photolithography, electroless plating, electrolytic plating, printing, sputtering, vacuum deposition, etc.

The second conductive layer 250 includes a plurality of elements 251, such as pads, traces or combination thereof. In the present embodiment, the elements 251 may include a plurality of first elements 251' and a plurality of second elements 251", wherein the first elements 251' and the second elements 251" are the second pads, for example. Although not illustrated, at least one first element 251' may connect to at least one second element 251".

Figure 6B:
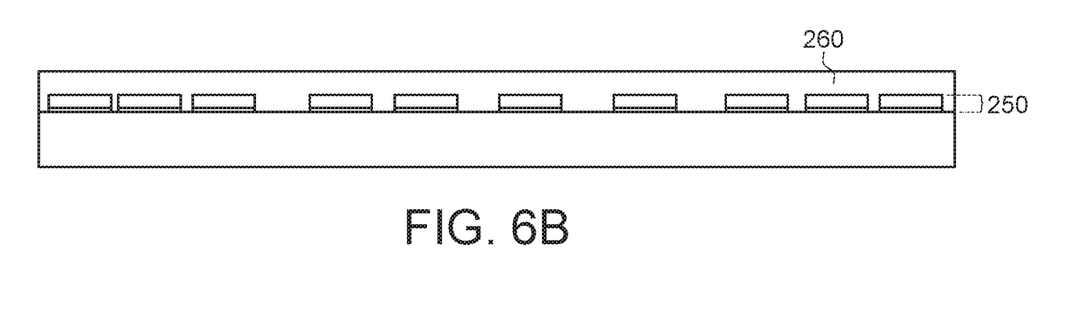

Referring to FIG. 6B, the second package body 260 encapsulating the second conductive layer 250 is formed on the carrier 170 using, for example, laminating technology. In the present embodiment, the second package body 260 is, for example, a lamination.

Figure 6C:
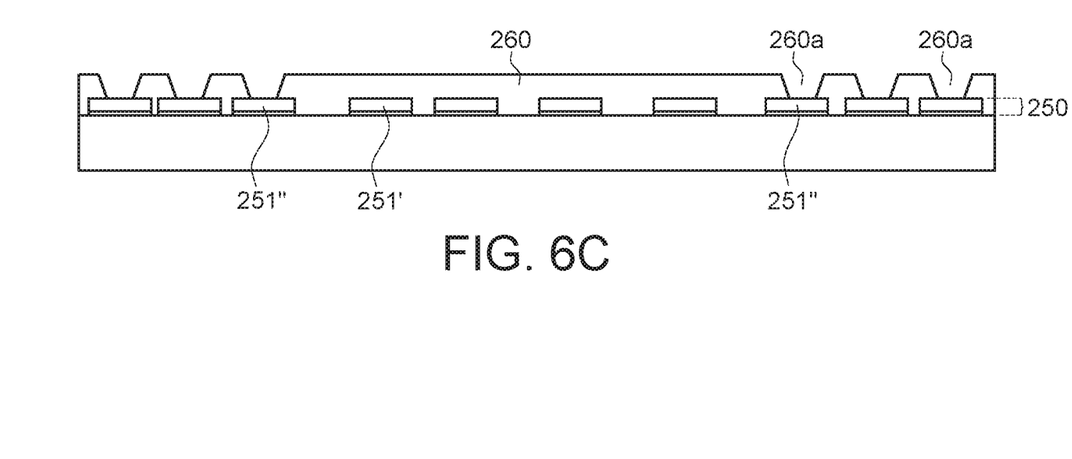

Referring to FIG. 6C, a plurality of openings 260a are formed on the second package body 260 to expose the second elements 251" of the second conductive layer 250 using, for example, photolithography, chemical etching, laser drilling, mechanical drilling, etc.

Figure 6D:
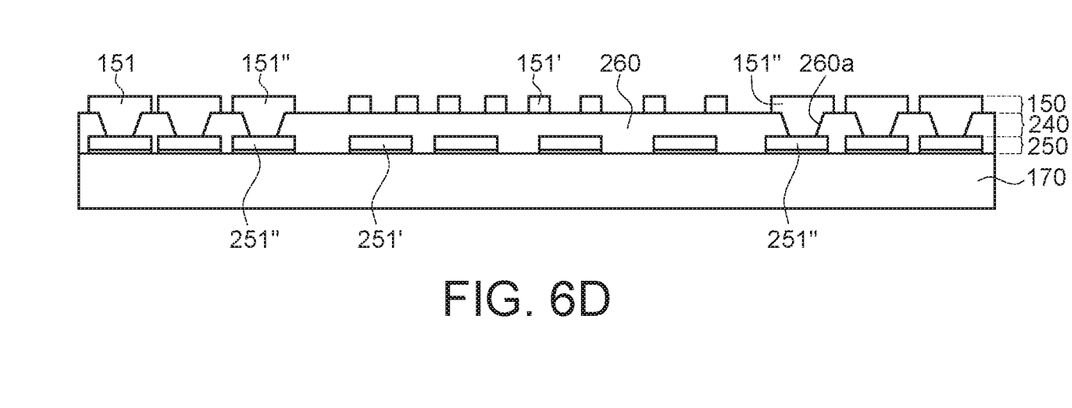

Referring to FIG. 6D, the second pillar layer 240 connecting the second elements 251" is formed through the openings 260a of the second package body 260.

Referring to FIG. 6D, the first conductive layer 150 is formed on the second pillar layer 240 and the second package body 260. In the present embodiment, the first conductive layer 150 is indirectly formed on the carrier 170 through the second pillar layer 240 and the second package body 260.

In the present embodiment, the first conductive layer 150 includes a plurality of the elements 151, such as pads, traces or combination thereof. In the present embodiment, the elements 151 may include a plurality of first elements 151' and a plurality of second elements 151", wherein the first elements 151' are traces, and the second elements 151" are first pads.

In addition, the second pillar layer 240 and the first conductive layer 150 may be formed in the same process or two individual processes, such as, electroless plating, electrolytic plating, printing, sputtering, vacuum deposition, etc.

Figure 6E:
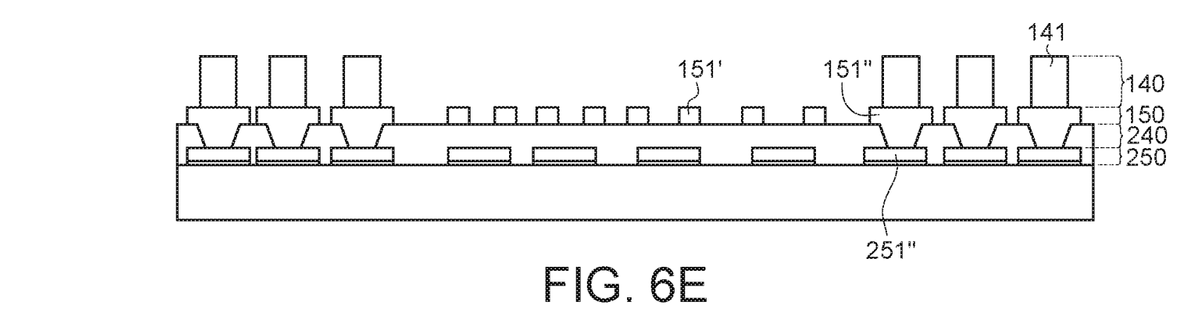

Referring to FIG. 6E, the first pillar layer 140 is formed on the first conductive layer 150 using, for example, electroless plating, electrolytic plating, printing, sputtering, vacuum deposition, etc. The first pillar layer 140 includes a plurality of pillars 141 disposed on the second elements 151" of the first conductive layer 150.

Figure 6F:
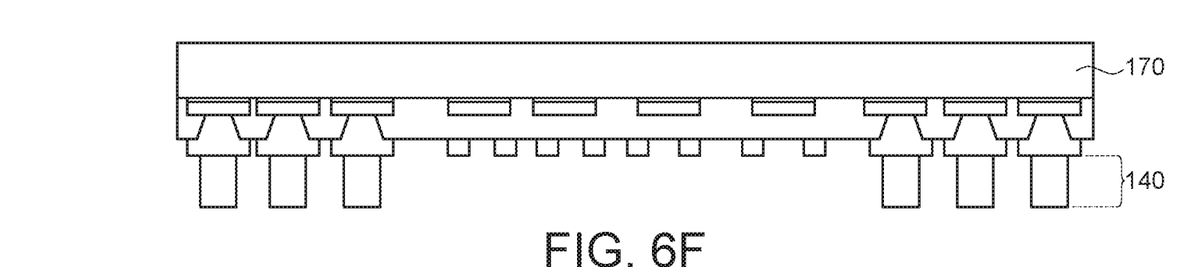

Referring to FIG. 6F, the carrier 170 is inverted, such that the first pillar layer 140 faces down.

Figure 6G:
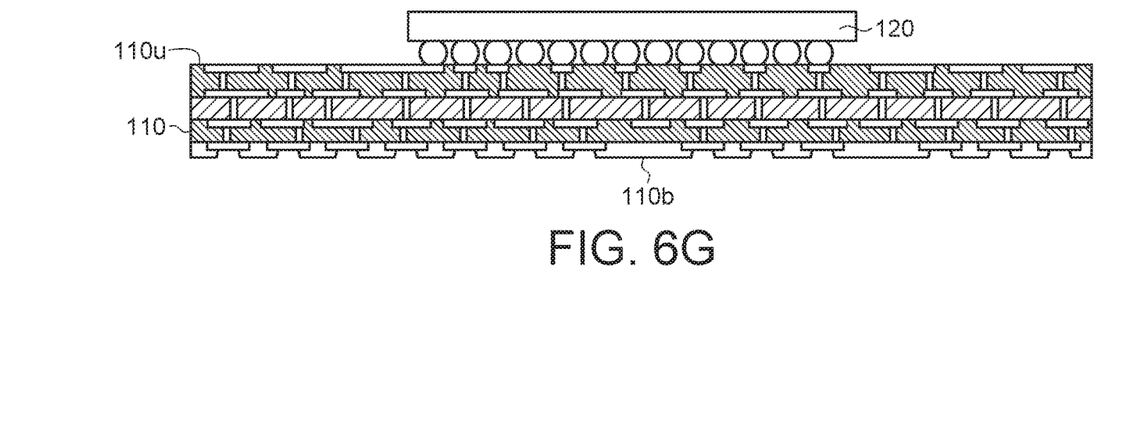

Referring to FIG. 6G, the first electronic component 120 is disposed on the substrate 110 using, for example, SMT.

Figure 6H:
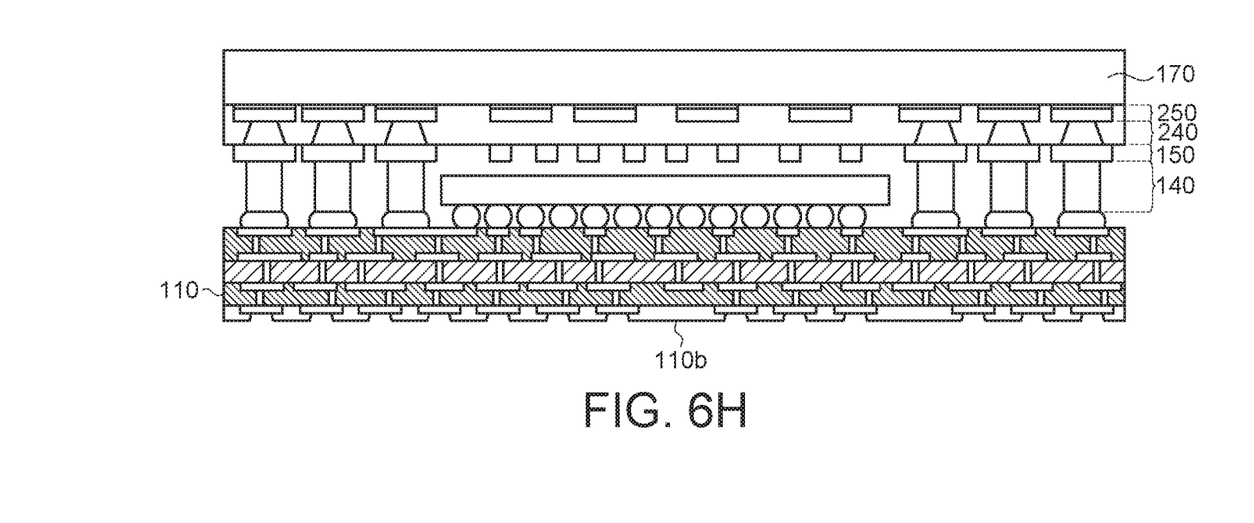

Referring to FIG. 6H, the second pillar layer 240, the second conductive layer 250 and the second package body 260 may form a package substrate. The package substrate connects to the substrate 110 through the first pillar layer 140 and the first conductive layer 150 using, for example, SMT.

Figure 6I:
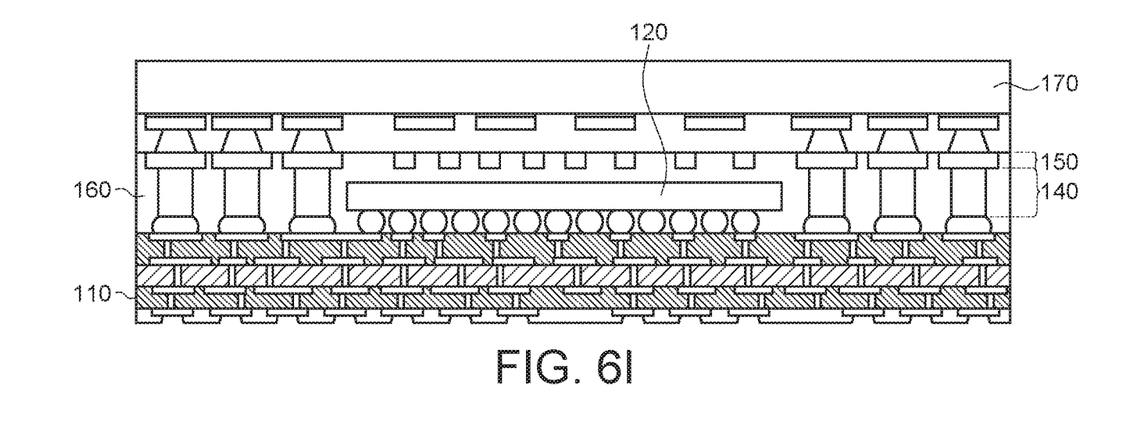

Referring to FIG. 6I, the first package body 160 encapsulating the first electronic component 120, the first conductive layer 150 and the first pillar layer 140 is formed. The first package body 160 may be formed by various packaging technologies, such as, for example, compression molding, injection molding, transfer molding or dispensing technology.

Figure 6J:
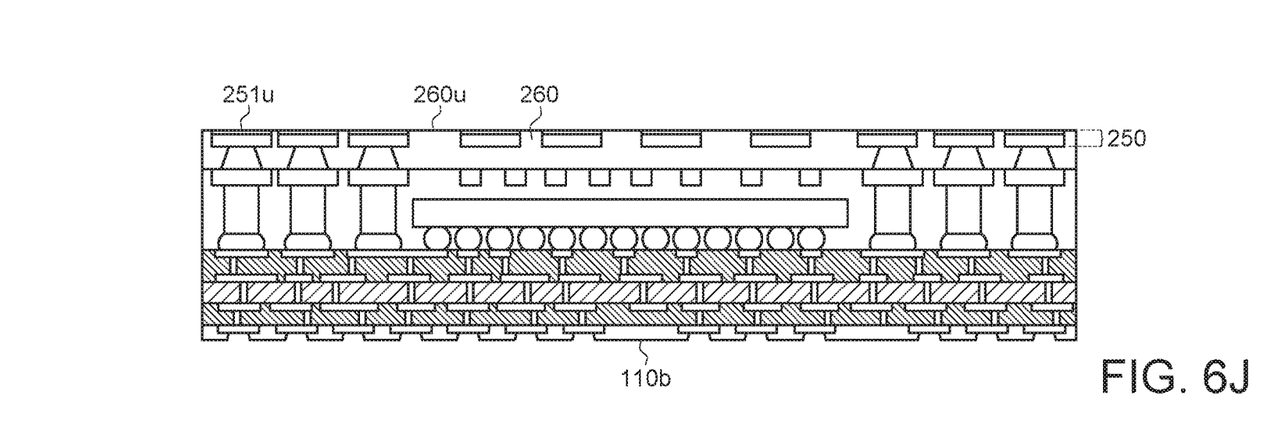

Referring to FIG. 6J, the carrier 170 is removed using, for example, ball mounting technology. After the carrier 170 is removed, the third upper surface 251u of the second conductive layer 250 and the fourth upper surface 260u of the second package body 260 are exposed, wherein the third upper surface 251u and the fourth upper surface 260u are aligned with each other. For example, the third upper surface 251u and the fourth upper surface 260u are coplanar.

Figure 6K:
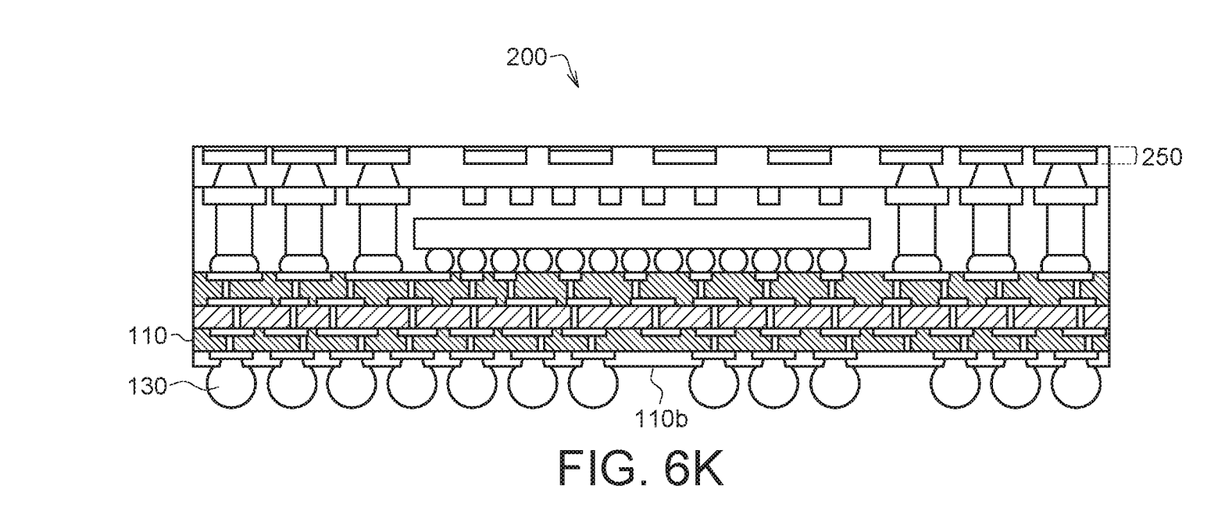

Referring to FIG. 6K, the conductive contacts 130 are formed on the bottom surface 110b of the substrate 110 using, for example, ball mounting technology, to form the semiconductor package 200 of FIG. 2.

In another embodiment, the second electronic component 11 of FIG. 2 may be disposed on the second conductive layer 250 of FIG. 6K to form the semiconductor device 20 of FIG. 4

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor package, comprising:
a substrate;
a first electronic component disposed on the substrate;
a first conductive layer;
a first package body encapsulating the first conductive layer and the first electronic component; and
a solder layer connecting the first conductive layer and the substrate;
wherein the first conductive layer is embedded in the first package body, and the first conductive layer includes a trace.

2. The semiconductor package as claimed in claim 1, wherein the first conductive layer comprises a first pad exposed from the first package body, and the trace connects with the first pad.

3. The semiconductor package as claimed in claim 2, wherein each of the first pad and the trace has a first lateral surface and a first upper surface, the first upper surface is exposed from the first package body, and the first lateral surface is encapsulated by the first package body.

4. The semiconductor package as claimed in claim 1, wherein the first conductive layer comprises a plurality of the traces formed above the first electronic component.

5. The semiconductor package as claimed in claim 1, wherein the first conductive layer has a thickness ranging between 10 micrometers and 20 micrometers.

6. The semiconductor package as claimed in claim 1, wherein the first package body is a molding compound.

7. The semiconductor package as claimed in claim 1, wherein the first conductive layer has a first upper surface, the first package body has a second upper surface, and the first upper surface is aligned with the second upper surface.

8. A semiconductor package, comprising:
a substrate;
a first electronic component disposed on the substrate;
a first conductive layer;
a solder layer connecting the first conductive layer and the substrate;
a first package body encapsulating the first conductive layer and the first electronic component;
a second conductive layer;
a second pillar layer connecting the first conductive layer and the second conductive layer; and
a second package body encapsulating the second conductive layer and the second pillar layer;

wherein the first conductive layer is embedded in the first package body.

9. The semiconductor package as claimed in claim 8, wherein the first conductive layer comprises a first pad exposed from the first package body, and a trace connecting to the first pad.

10. The semiconductor package as claimed in claim 9, wherein each of the first pad and the trace has a first lateral surface and a first upper surface, the first upper surface is exposed from the first package body, and the first lateral surface is encapsulated by the first package body.

11. The semiconductor package as claimed in claim 8, wherein the first conductive layer comprises a plurality of traces formed above the first electronic component, and the second conductive layer comprises a plurality of second pads formed above the traces.

12. The semiconductor package as claimed in claim 8, wherein the first conductive layer has a first upper surface, the first package body has a second upper surface, and the first upper surface is aligned with the second upper surface.

13. The semiconductor package as claimed in claim 8, wherein the second conductive layer comprises a second pad exposed from the second package body.

14. The semiconductor package as claimed in claim 13, wherein the second pad has a second lateral surface and a third upper surface, the third upper surface is exposed from the second package body, and the second lateral surface is encapsulated by the second package body.

15. The semiconductor package as claimed in claim 8, wherein the first conductive layer has a thickness ranging between 10 micrometer and 20 micrometer.

16. The semiconductor package as claimed in claim 8, wherein the first package body is a molding compound.

17. The semiconductor package as claimed in claim 8, wherein the second package body is a lamination layer.

18. The semiconductor package as claimed in claim 8, wherein the second conductive layer has a third upper surface, the second package body has a fourth upper surface, and the third upper surface is aligned with the fourth upper surface.

19. A semiconductor device, comprising:
a semiconductor package as claimed in claim 1; and
a second electronic component disposed on the first conductive layer of the semiconductor package.

20. A semiconductor device, comprising:
a semiconductor package as claimed in claim 8; and
a second electronic component disposed on the second conductive layer of the semiconductor package.

* * * * *